(12) United States Patent
Maiti et al.

(10) Patent No.: US 12,072,542 B2
(45) Date of Patent: Aug. 27, 2024

(54) INTEGRATED PHOTONIC DEVICE UTILIZING STRAINED 2D MATERIAL

(71) Applicant: The George Washington University, Washington, DC (US)

(72) Inventors: Rishi Maiti, Washington, DC (US); Volker Sorger, Alexandria, VA (US); Chandraman Sadanand Patil, Washington, DC (US)

(73) Assignee: The George Washington University, Washington, DC (US)

( * ) Notice: Subject to any disclaimer, the term of this patent is extended or adjusted under 35 U.S.C. 154(b) by 0 days.

(21) Appl. No.: 17/771,763

(22) PCT Filed: Nov. 20, 2020

(86) PCT No.: PCT/US2020/061539
§ 371 (c)(1),
(2) Date: Apr. 25, 2022

(87) PCT Pub. No.: WO2021/102281
PCT Pub. Date: May 27, 2021

(65) Prior Publication Data
US 2022/0373751 A1 Nov. 24, 2022

Related U.S. Application Data

(60) Provisional application No. 62/938,116, filed on Nov. 20, 2019.

(51) Int. Cl.
*G02B 6/42* (2006.01)

(52) U.S. Cl.
CPC .................... *G02B 6/4295* (2013.01)

(58) Field of Classification Search
CPC ... G02B 6/4295; G02F 1/0131; G02F 1/2257; B82Y 20/00; H01L 33/36;
(Continued)

(56) References Cited

U.S. PATENT DOCUMENTS

2016/0181516 A1 6/2016 Reed et al.
2019/0258088 A1 8/2019 Lipson et al.
(Continued)

OTHER PUBLICATIONS

International Search Report and Written Opinion for PCT/US2020/061539 dated Mar. 3, 2021, 11 pgs.
(Continued)

*Primary Examiner* — John Bedtelyon
(74) *Attorney, Agent, or Firm* — BLANK ROME LLP

(57) ABSTRACT

A photonic device that includes two electrodes and a two-dimensional (2D) material electrically connecting the two electrodes. The 2D material may be molybdenum ditelluride. Strain may be induced in the 2D material (e.g., by placing the 2D material on a waveguide) to reduce the band gap of the 2D material and increase the efficiency of the photodetector. The photonic device may be a photodetector with 2D material that absorbs light energy and converts it into a photocurrent in a circuit that includes the two electrodes. The photonic device may be an emitter with 2D material that emits light energy in response to an electric field across the two electrodes. The photonic device may be a modulator with 2D material that modulates a property of an optical signal (e.g., the amplitude or phase) by modulating the amount of strain induced in the 2D material.

24 Claims, 9 Drawing Sheets

(58) Field of Classification Search
CPC ....... H01L 31/035281; H01L 31/03529; H01L 31/108; H01L 33/26; H01L 31/022408
See application file for complete search history.

(56) References Cited

U.S. PATENT DOCUMENTS

2020/0057350 A1    2/2020  Amin et al.
2020/0057354 A1*   2/2020  Cao .................... G02F 1/313

OTHER PUBLICATIONS

Z. Li, et al., "Efficient Strain Modulation of 2D Materials via Polymer Encapsulation", Nature Communications, https://doi.org/10.1038/s41467-020-15023-3; 2020, 8 pgs.
Y. Zhu, et al., "High-Efficiency Monolayer Molybdenum Ditelluride Light-Emitting Diode and Photodetector", Applied Materials & Interfaces, 2018, vol. 10, pp. 43291-43298.
M. Turunen, "Single-Photon Emission from Strained Two-Dimensional Transition Metal Dichalcogenides", Master Thesis, Apr. 2018, pp. 1-63.
S. Zhang, et al., "Theoretical Study of Strained Black Phosphorus Photodetector Integrated with Silicon Waveguide", Proceedings of SPIE, vol. 8615, Jan. 2019, 15 pgs.
R. Maiti, et al., "Strain-Engineered High Responsivity $MoTe_2$ Photodetector for Silicon Photonic Integrated Circuits", Cornel University Library, Oct. 2019, 17 pgs.
Ya-Qing Bie, et al., "A $MoTe_2$-Based Light-Emitting Diode and Photodetector for Silicon Photonic Integrated Circuits", Nature Nanotechnology, vol. 12, Dec. 2017, pp. 1124-1130.

* cited by examiner

INTEGRATED PHOTONIC DEVICE UTILIZING STRAINED 2D MATERIAL

CROSS-REFERENCE TO RELATED APPLICATIONS

This application claims priority to U.S. Prov. Pat. Appl. No. 62/938,116, filed Nov. 20, 2019, which is hereby incorporated by reference.

FEDERAL FUNDING

This application is a national phase application of PCT/US2020/061539, filed Nov. 20, 2020, which claims priority to of U.S. Prov. Pat. Appl. No. 62/938,116, filed Nov. 20, 2019. The contents of these applications are hereby incorporated by reference in their entirety.

BACKGROUND

Photonic devices include photodetectors, light emitters, and light modulators. A photodetector, also called a photosensor, may be any device that senses light or other electromagnetic radiation by converting light photons into an electrical current. A light emitter may be any light source that emits light when current flows through it. A light modulator may be any device that modulates one or more properties (e.g., the amplitude, frequency, or phase) of light.

FIG. 1 is an example of a conventional photodetector 100. As shown in FIG. 1, the photodetector 100 includes two electrodes 110 and 190 and a photoconductive material 150. As light energy E interacts with the photoconductive material 150, the photoconductive material 150 absorbs the light energy E and converts that light energy E into an electric energy, which may be collected in terms of photo current i.

FIG. 2 is an example of a conventional light emitter 200. Like the photodetector 100, the light emitter 200 includes two electrodes 110 and 190 and a photoconductive material 150. However, the light emitter 200 works in reverse. The photoconductive material 150 converts electrical energy, such as a bias voltage V across the two electrodes 110 and 190, into light energy E and emits light.

In solid materials, the ability of electrons to act as charge carriers depends on the availability of vacant electronic states. Those vacant electron states allow the electrons to increase their energy (i.e., accelerate) when an electric field is applied. Materials are characterized as having a valence band and a conduction band. The valence band is the outermost electron orbital of an atom of any specific material that electrons actually occupy. When excited, electrons jump out of the valence band and into the conduction band.

The energy difference between the highest occupied energy state of the valence band (i.e. valence band maximum) and the lowest unoccupied state of the conduction band (i.e. conduction band minimum) is called the "band gap" and is indicative of the electrical conductivity of a material. The difference between conductors, insulators, and semiconductors can be shown by how large their band gap is. Insulators are characterized by a large band gap, so a prohibitively large amount of energy is required to move electrons out of the valence band to form a current. Conductors have an overlap between the conduction and valence bands, so the valence electrons in such conductors are essentially free. Semiconductors, on the other hand, have a small band gap that allows for a meaningful fraction of the valence electrons of the material to move into the conduction band given a certain amount of energy.

The ability of a photonic device to convert light energy E to electrical energy depends on the band gap of the photoconductive material 150, which dictates how efficiently the material can absorb depending on the frequency of the light energy E. In optical telecommunications systems, the most widely used wavelength is 1550 nanometers (nm). Prior art photoconductive materials 150 are inefficient at absorbing light energy and converting that light energy to an electrical signal because they have a large band gap—generally between 1 and 3 electronvolts (eV)—at the 1550 nm telecommunications wavelength.

Prior art photoconductive materials 150 have a large band gap and are therefore inefficient at absorbing light energy and converting that light energy to an electrical signal. Therefore, there is a need for photonic devices with a material that can absorb light more efficiently at 1550 nm.

SUMMARY

In order to overcome those and other disadvantages of the prior art, a photonic device that includes two electrodes and a two-dimensional (2D) material electrically connecting the two electrodes is provided. The 2D material may be molybdenum ditelluride ($MoTe_2$). Strain may be induced in the 2D material (e.g., by placing the 2D material on a waveguide) to reduce the band gap of the 2D 
material and increase the efficiency of the photodetector.

The photonic device may be a photodetector with a strained 2D material that absorbs light energy and converts it into a photocurrent in a circuit that includes the two electrodes. The photonic device may be an emitter with a strained 2D material that emits light energy in response to an electric field across the two electrodes. The photonic device may be a modulator with a strained 2D material that modulates a property of an optical signal (e.g., the amplitude or phase) by modulating the amount of strain induced in the 2D material.

BRIEF DESCRIPTION OF THE DRAWINGS

The accompanying drawings are incorporated in and constitute a part of this specification. It is to be understood that the drawings illustrate only some examples of the disclosure and other examples or combinations of various examples that are not specifically illustrated in the figures may still fall within the scope of this disclosure. Examples will now be described with additional detail through the use of the drawings.

DETAILED DESCRIPTION

Figure 1:
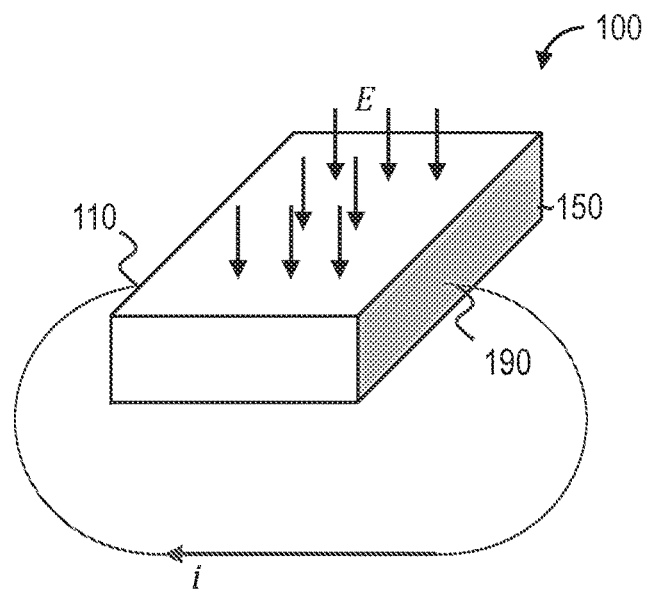
FIG. 1 is an example of a conventional photodetector.
Figure 2:
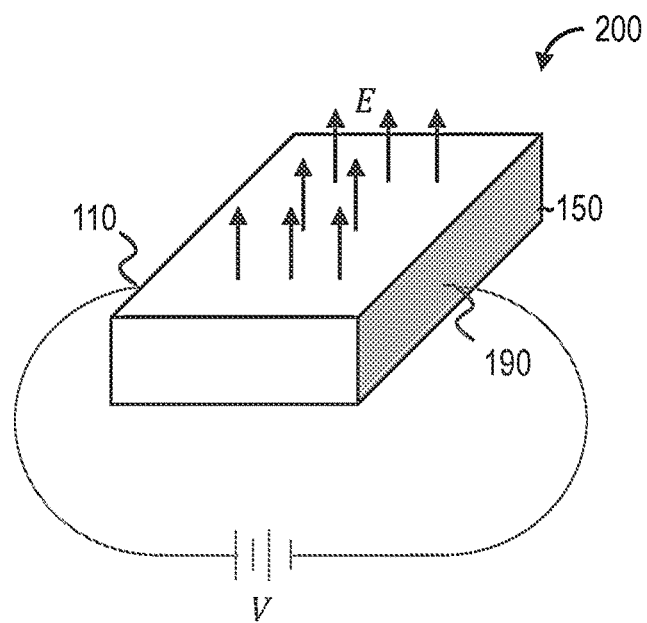
FIG. 2 is an example of a conventional light emitter.

In describing the illustrative, non-limiting embodiments illustrated in the drawings, specific terminology will be resorted to for the sake of clarity. However, the disclosure is not intended to be limited to the specific terms so selected, and it is to be understood that each specific term includes all technical equivalents that operate in similar manner to accomplish a similar purpose. Several embodiments are described for illustrative purposes, it being understood that the description and claims are not limited to the illustrated embodiments and other embodiments not specifically shown in the drawings may also be within the scope of this disclosure.

Photonic Devices

Figure 3A:
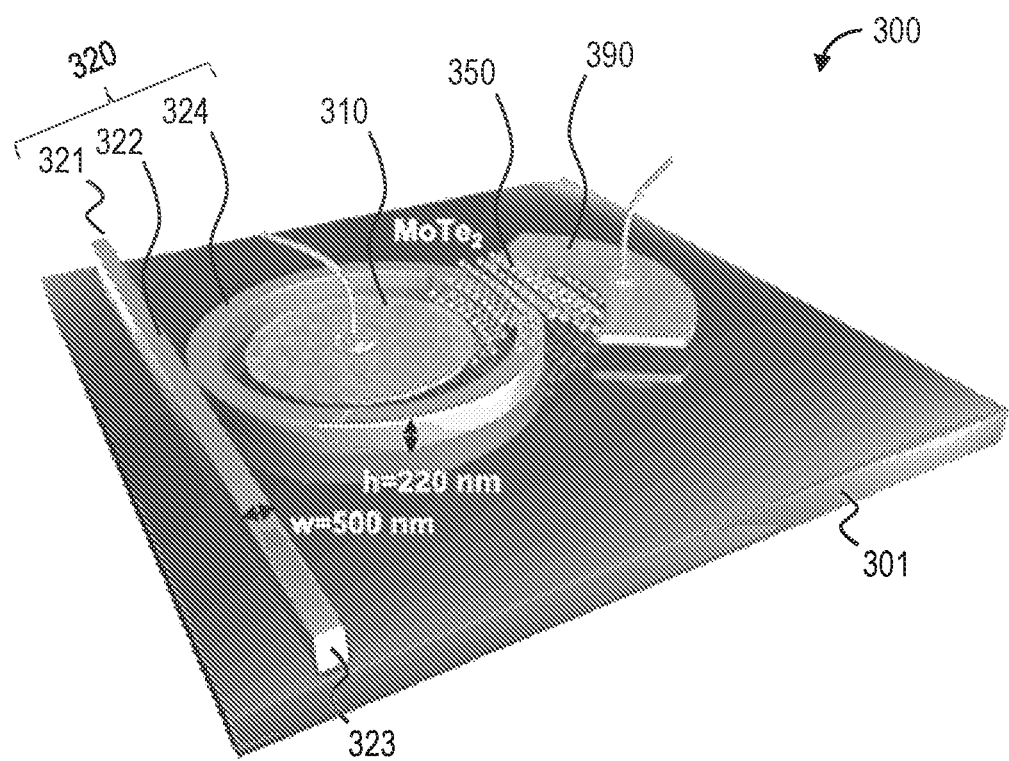
FIG. 3A is a diagram of a photonic device according to an exemplary embodiment.
Figure 3B:
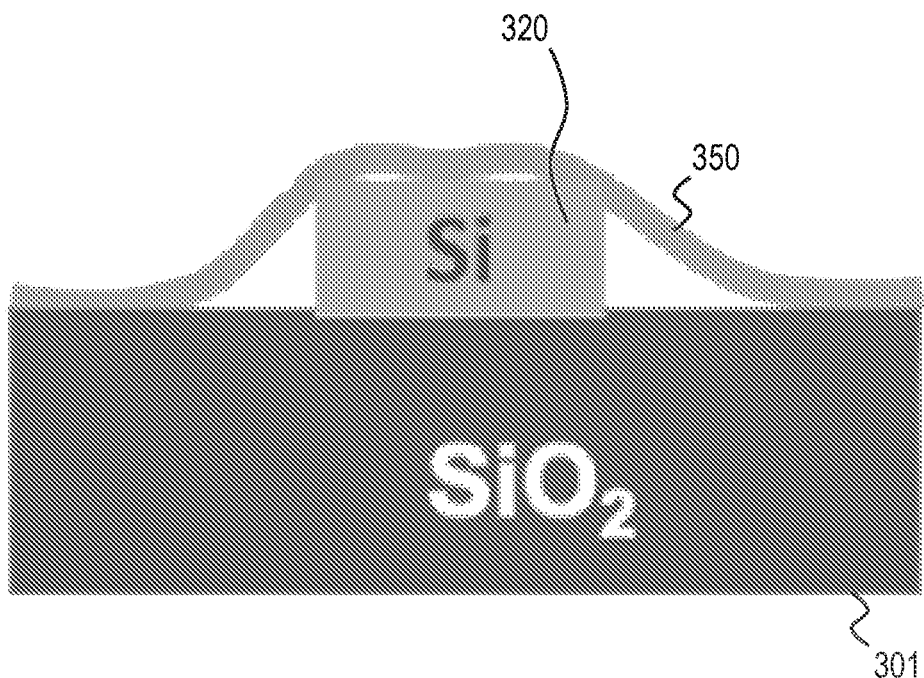
FIG. 3B is another diagram of the photonic device of FIG. 3A according to an exemplary embodiment.

FIGS. 3A and 3B are diagrams of a photonic device 300 according to exemplary embodiments.

As shown in FIGS. 3A and 3B, the photonic device 300 includes two electrodes 310 and 390. In the example shown in FIG. 3A, the photonic device 300 also includes a waveguide 320. The photonic device 300 may be an "on-chip" device that includes a substrate 301, for example a silicon dioxide ($SiO_2$) substrate.

The waveguide 320 includes a linear waveguide 322 coupled to a ring resonator 324. The linear waveguide 322 includes an input 321 and an output 323. When a beam of light passes through the linear waveguide 322 (from the input 321 to the output 323), part of the light energy E is coupled into the ring resonator 324. As light of the resonant wavelength is passed through the ring resonator 324, constructive interference causes the light to build up in intensity over multiple round trips through the ring resonator 324.

As mentioned above, prior art photoconductive materials 150 are inefficient at absorbing light energy and converting that light energy to an electrical signal because they have a large band gap (e.g., 1-2 eV) at the 1550 nm telecommunications wavelength. Accordingly, the photonic device 300 includes a two-dimensional (2D) material 350 electrically connected to the two electrodes 310 and 390. The 2D material 350 (or "single-layer material") is a crystalline material consisting of a single layer of atoms.

In a preferred embodiment, the 2D material 350 is molybdenum ditelluride ($MoTe_2$). As described in detail below, the photonic device 350 may include a single layer of 2D material 350, a vertical or lateral heterojunction of a plurality of 2D materials 350, or a combination of 2D materials 350 with non-2D materials. The 2D material(s) 350 may include material selections from the class of van-der-Waals group, such as transition-metal-dichalcogenides, group IV, for example, or other materials including those with properties such as semiconductors, oxides, or semi-metals.

Stress is generally referred to here as any force applied to a material and can be determined as the force divided by the material's cross-sectional area. Strain is the deformation or displacement of material that results from an applied stress. As described in detail below, inducing strain in the 2D material 350 reduces the band gap of the 2D material 350 at the wavelength of interest (e.g., 1550 nm). For $MoTe_2$, for instance, inducing strain reduces the band gap from about 1.04 eV to about 0.8 eV. Reducing the band gap enhances the ability of the 2D material 350 to absorb light energy E, increasing the photocurrent i generated in response to the light energy E and increasing the efficiency of the photonic device 300. 2D materials are particularly effective because they can sustain more strain. Bulk three-dimensional materials can generally withstand about 0.1 percent strain before experiencing lattice defects or dislocations. 2D materials, on the other hand, can sustain much higher amounts (greater than 10 percent) of strain. Accordingly, the photonic device 300 may include a 2D material 350, specifically $MoTe_2$, with an induced strain.

Strain in the 2D material 350 may be imposed by any suitable technique, such as by bending and/or stretching the flexible 2D material 350 (e.g., mechanically or using piezoelectric substrate actuation), pre-stretching and relaxing the 2D material 350, modifying the topography of the substrate surface of the 2D material 350, suspending the 2D material 350 and pressurizing blisters and/or performing indentation, etc.

As shown in FIG. 3B, the waveguide 320 may be non-planarized and strain may be induced in the 2D material 350 by placing the 2D material 350 on top of the non-planarized waveguide 320 (e.g., on top of the ring resonator 324). For instance, the waveguide may have a rectangular cross section with a 220-nm height and a 500-nm width. By placing the 2D material 350 on top of the waveguide 320, strain is induced in the 2D material 350 as the 2D material 350 is bent over the waveguide 320 (e.g., the ring resonator 324) and maintains a mechanical connection to the electrodes 310 and 390 below the top of the waveguide 320 on opposite sides of the waveguide 320. More broadly, the photonic device 300 may include any topology surface-height modulated interface, which may include a waveguide 320, and strain may be induced in the 2D material 359 by placing the 2D material 350 on top of the topology surface-height modulated interface.

In some embodiments, the photonic device 300 may be a photodetector. In those embodiments, light energy E travels through the linear waveguide 322 from the input 321 to the output 323. Part of that light energy E is coupled into the ring resonator 324 as described above. The 2D material 350 absorbs part of the light energy E in the ring resonator 324 and converts it to a photocurrent i in a circuit between the electrodes 310 and 390.

In other embodiments, the photonic device 300 may be a light emitter (e.g., a quantum emitter). In those embodiments, the 2D material 350 emits light energy E, in some instances via a waveguide 320, in response to an electric field (e.g., a bias voltage applied across the electrodes 310 and 390), an injected current, an optically pumped excitation, etc.

In other embodiments, the photonic device 300 may be a modulator that modulates the amplitude of an optical signal. Referring back to the example in FIG. 3A, part of the light energy E received by the input 321 is coupled into the ring resonator 324, where it interacts with the 2D material 350. Also, part of the light energy E in the ring resonator 324 is coupled back into the linear waveguide 322, where it is output by the output 323. The amount of light energy E absorbed by the 2D material 350 varies in response to the amount of strain induced in the 2D material 350. Accordingly, the amplitude of the optical signal output by the output 321 varies in response to the amount of strain induced in the 2D material 350. A number of known methods exist to dynamically modulate the amount of strain induced in a 2D material 350 (see, e.g., Li, et al., Efficient strain modulation of 2D materials via polymer encapsulation, Nat Commun., 2020 Mar. 2; 11(1):1151, doi: 10.1038/s41467-020-15023-3). The photonic device 300 may modulate the modulate the amount of strain induced in the 2D material 350, for example, by bending or stretching the 2D material 350, in response to a software-implemented signal from a microcontroller, via piezoelectric substrate actuation. Therefore, the photonic device 300 may be configured to modulate the amount of strain induced in the 2D material 350 in order to modulate the amplitude of the optical signal output by the output 323. Accordingly, the photonic device 300 may be a modulator that modulates the amplitude of an optical signal by dynamically adjusting the strain of the 2D material 350.

In other embodiments, the photonic device may be a modulator that modulates the phase of an optical signal.

Figure 4:
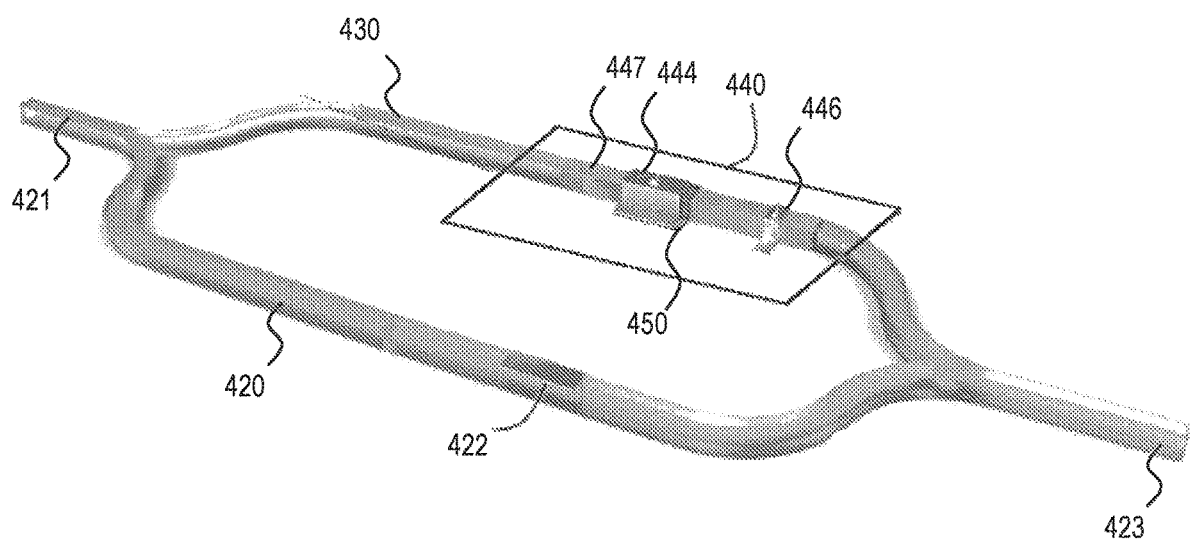
FIG. 4 is a diagram of another photonic device according to another exemplary embodiment.

FIG. 4 is a diagram of a photonic device 400 according to an exemplary embodiment. The photonic device 400 may be, for example, a Mach-Zehnder interferometer of the type described in U.S. Pat. Pub. No. 2020/0057350.

As shown in FIG. 4, the photonic device 400 includes a waveguide with an input 421 and an output 423. Between the input 421 and the output 423, the waveguide is split to form a passive arm 420 with a passive contact 422 and an active arm 430 with an active module 440. In the example shown in FIG. 4, the active module 440 includes a biasing metal contact 444 on a 2D material 450, a gate dielectric 447 (e.g., aluminum oxide), and a ground contact 446 for completing the lateral capacitor. Like the 2D material 350 of the photonic device 300, the 2D material 450 of the photonic device 400 may be molybdenum ditelluride (MoTe$_2$) with an induced strain. While strain may be induced in the 2D material 450 by placing the 2D material 450 on the active arm 430 of the waveguide, the amount of strain induced may also be dynamically modulated.

An optical signal received by the input 421 is separated between the passive arm 420 and the active arm 430 and recombined before being output by the output 423. As described above, the 2D material 450 interacts with the light energy E that travels along the active arm 430 and introduces a delay on the portion of the optical signal along the active arm 430. That delay introduces a phase difference between the portion of the optical signal along the active arm 430 and the portion of the optical signal along the passive arm 420. As described above, the delay imposed on the portion of the optical signal along the active arm 430 varies based on the amount of strain in the 2D material 450. Meanwhile, a number of methods exist to dynamically modulate the amount of strain induced in the 2D material 450. For example, the photonic device 400 may modulate the amount of strain induced in the 2D material 450 by bending or stretching the 2D material 450, in response to a software-implemented signal from a microcontroller, via piezoelectric substrate actuation. Therefore, the photonic device 400 may be configured to modulate the amount of strain induced in the 2D material 350 in order to modulate the phase difference between the portion of the optical signal along the active arm 430 and the portion of the optical signal along the passive arm 420. Accordingly, the photonic device 400 may be a modulator that modulates the phase of an optical signal by dynamically adjusting the strain of the 2D material 450.

Inducing strain in the 2D materials 350 and 450 allows the photonic devices 300 and 400 to be tuned such that they efficiently emit, modulate, and detect optical signals of a specific frequency (e.g., 1550 nm). Accordingly, multiple photonic devices 300 (and/or 400) with a strained 2D material 350 (and/or 450) may be used together in an optical communications system. The optical communications system may include, for example, an emitter with a strained 2D material 350 that emits and optical signal and a photodetector with a strained 2D material 350 that receives the optical signal output by the emitter. The system may also include a modulator with a strained 2D material 450 that modulates the optical signal output by the emitter. In those embodiments, the photodetector with the strained 2D material 350 may receive the modulated optical signal modulated by the modulator with the strained 2D material 450.

Strained Molybdenum Ditelluride (MoTe$_2$)

Strain engineering of traditional semiconductors (e.g., silicon-germanium or III-V semiconductors) can be utilized to enhance the performance of electronic and photonic devices. By inducing strain, the electronic band structure can be modified such as achieved by epitaxial growth techniques to control the lattice constant, which, for example, can enable a reduction of the effective mass and, thus, positively impacting mobility. However, in general, bulk three dimensional materials often associated with low failure strain (about 0.1 percent) thus limiting their applications to the extent to which their properties can be modified due to the existence of the lattice defects and dislocations. On the other hand, 2D materials can sustain higher amounts of strain (>10%), offering a promising platform for strain-engineered integrated devices (such as those illustrated in FIGS. 3 and 4).

Moreover, strain in 2D materials can be achieved by several techniques which include (a) bending and stretching of flexible substrates, (b) relaxation of pre-stretched substrates, (c) substrate surface topography modification, (d) pressurized blisters and tip indentation of suspended 2DMs, and (e) piezoelectric substrate actuation, as compared to their bulk 3D counterpart where the strain is typically applied by forcing the epitaxial growth of a material on top of another material with a certain lattice parameter mismatch. A straightforward method to achieve strain in 2D nanocrystals is through mechanical bending, such as transferring them onto flexible substrates or wrapping them around a pre-patterned structure. Under small (e.g., less than 2 percent) compressive (tensile) strain, the bandgap increases (decreases) and can even induce a semiconductor-to-metal phase transition (10 percent for monolayer) in molybdenum disulfide (MoS$_2$). Furthermore, a strain-induced exciton redshift and exciton funnel effect are present in few-layer MoS2 crystals. Recently, it was shown that strain can strongly modulate the bandgap energy (~70 meV) of monolayer molybdenum ditelluride (MoTe$_2$) and MoWTe2 for 2.3% of uniaxial strain. Beyond such pioneering demonstrations, however, there is a lack of experimental evidence of strain-induced bandgap engineered optoelectronic devices, which is needed to assess the potential of this class of materials as building blocks for the future integrated photonic platform, particularly at certain technologically-relevant spectral regions such as the telecommunication bands at near infrared frequencies.

Therefore, our focus is to investigate the effect of induced strain in 2D materials with local strain mapping allowing for insights into light matter interaction enabling an additional "control knob" for device engineering that has not been combined with integrated opto-electronics previously. Here, strain can be applied, like electric field in a field effect transistor, which opens up endless possibilities to design devices with novel functionalities. It offers a powerful route to modify electronic and optical properties by tuning their electronic band structure of the material. Therefore, it is critical to understand the correlation as a function of strain for the certain physical parameter which is responsible to obtain highest figure of merits (FOM) for any photonic devices.

Induced strain in 2D materials may be used in photonic integrated circuit for on-chip photonic devices—including emitters, modulators, and detectors—by using spatially controlled strain. For example, here we consider a photodetector, which is an integral part for photonic circuitry that converts the photons to electric signal across the electromagnetic spectrum (ultraviolet to microwave), thus enabling a plethora of applications. Several conventional semiconductors with suitable bandgaps have been used as photosensitive materials to construct photodetectors. For instance, silicon (Si) has been widely used for visible and near infrared (NIR) light detection because of the matured silicon complementary metal-oxide-semiconductor (CMOS) technologies. However, Si has a bandgap of about 1.1 eV, making silicon a transparent material for most of the IR spectrum. Hence, for data communication and signal processing, a monolithically integrated photodetector at the wavelength of 1550 nm bears scientific and technologically relevant properties because it overlaps with the gain spectrum of erbium-doped-fiber-amplifiers and is transparent for foundry-based silicon photonics. The current state-of-the-art NIR photodetectors utilize indium gallium arsenide (InGaAs), indium phosphide (InP), and germanium (Ge) due to their high absorption (greater than 90 percent) at telecommunication wavelengths. However, III-V materials are not compatible with Si CMOS technology due to the complexity of growth, wafer bonding issues, thermal budget, etc. On the other hand, Ge photodetectors typically show higher noise due to the presence of defects and a dislocation center at the Si—Ge interface during the epitaxial growth process.

In contrast, heterogeneous integration of 2D materials with photonic platforms (silicon, silicon nitrate or indium phosphide) bears several advantages, but also has its own challenges. In brief, the advantages are that 2D materials are compatible with almost any substrate due to absence of lattice matching requirements (weakly bonded van der Waals forces), are composition controllable enabling alloys towards material-design control, have a form factor that is synergistic with light-matter-interaction approaches such as found in nano-optics and photonics, feature high electro-optic response (unity-strong index change, n>1), and show room temperature-stable excitons. The challenges are that 2D materials require transfer techniques (seeded growth has only limited applicability) and often have low mobilities (1-10 cm$^2$/Vs), although some 2D materials actually outperform silicon (e.g. graphene and black phosphorus).

The prominent example of graphene-based integrated photodetectors, while being functional, has a fundamental challenge to achieve low dark current due to the gapless band structure when operated in the photoconductive mode. Black phosphorus, a 2D nanocrystal of phosphorus, shows high responsivity and low dark current at 1550 nm. However, the low stability under ambient conditions limits its application.

As shown in FIGS. 3A and 3B, we demonstrate a strain-engineered photodetector by heterogeneously integrating a multi-layer (ML) 2H—MoTe$_2$ crystal flake atop a silicon microring resonator (MRR). The photonic device 300 exhibits its spatially varying strain, thus resulting in a graded bandgap 2D material photodetector at the photonic integrated circuit (PIC)-relevant wavelength of 1550 nm. Intentionally wrapping a MoTe$_2$ nanocrystal around a non-planarized waveguide 320 induces local tensile strain overlapping with the waveguide's optical mode. This idea is used in a photonic integrated circuit as improved on-chip photonic devices including emitter, modulator and detector by using spatially controlled strain. The non-planarized waveguide structure can induce a spatially tunable bandgap enabling broadband absorption. Our photodetector has the advantages of high responsivity, low noise equivalent power (NEP), small footprint, and low energy consumption with moderate speed, which enables high density on-chip photonic integration.

Continuous tuning of physical properties by controlling the mechanical deformation, such as strain, offers possibilities for significantly modifying both the electronic and photonic properties of 2D materials. Here, our approach is to exploit strong local uniaxial strain towards reducing the optical bandgap of ML MoTe$_2$ nanocrystals co-integrated onto Si photonic waveguide-based structures. However, this approach can be articulated for any other 2D materials and can be integrated on different photonic devices, such as straight waveguide, Mach Zehnder interferometer (MZI), photonic crystal cavity or plasmonic slot cavity for different wavelength regime (near exciton and away from exciton resonance). As an example, here we show that such setup enables photodetection at the technologically relevant wavelength of 1550 nm. Bulk MoTe$_2$ is an indirect gap semiconductor with a bandgap of 1.04 eV, where the conduction band minimum lies along K-symmetry line and the valence band maximum is located at the K point. Naturally, pristine ML (non-strained) MoTe$_2$ is associated with low absorption at 1550 nm resulting in low photo responsivity of only a few mA/W due to a roll-off in the absorption edge, as demonstrated by a flat MoTe$_2$ atop a planarized waveguide. However, intentionally wrapping the 2D film around a non-planarized waveguide (of a height of about 220 nm) induces a localized tensile strain near the waveguide. Fundamentally, the performance of 2D material-based photonic devices is determined by the ability of the mode of optical waveguide to interact with the 2D nanocrystal. One typical approach to circumvent such a limitation is to place the 2D film onto a planar waveguide and evanescently couple to the optical mode so that optical interaction length is not only dictated by the 2D film thickness, but rather by its longitudinal length. Such brute-force device engineering, however, results in sizable device footprints, thus negatively impacting the electrical device performance measures, for example the energy-per-bit efficiency and RC response time, which are both adversely affected by increased electrical capacitance. To reduce the footprint and improve electrical performance, here, the photonic device 300 integrates 2D nanocrystals with a microring resonator 320 (MRR), thus increasing the weak light-matter interaction.

Figure 5:
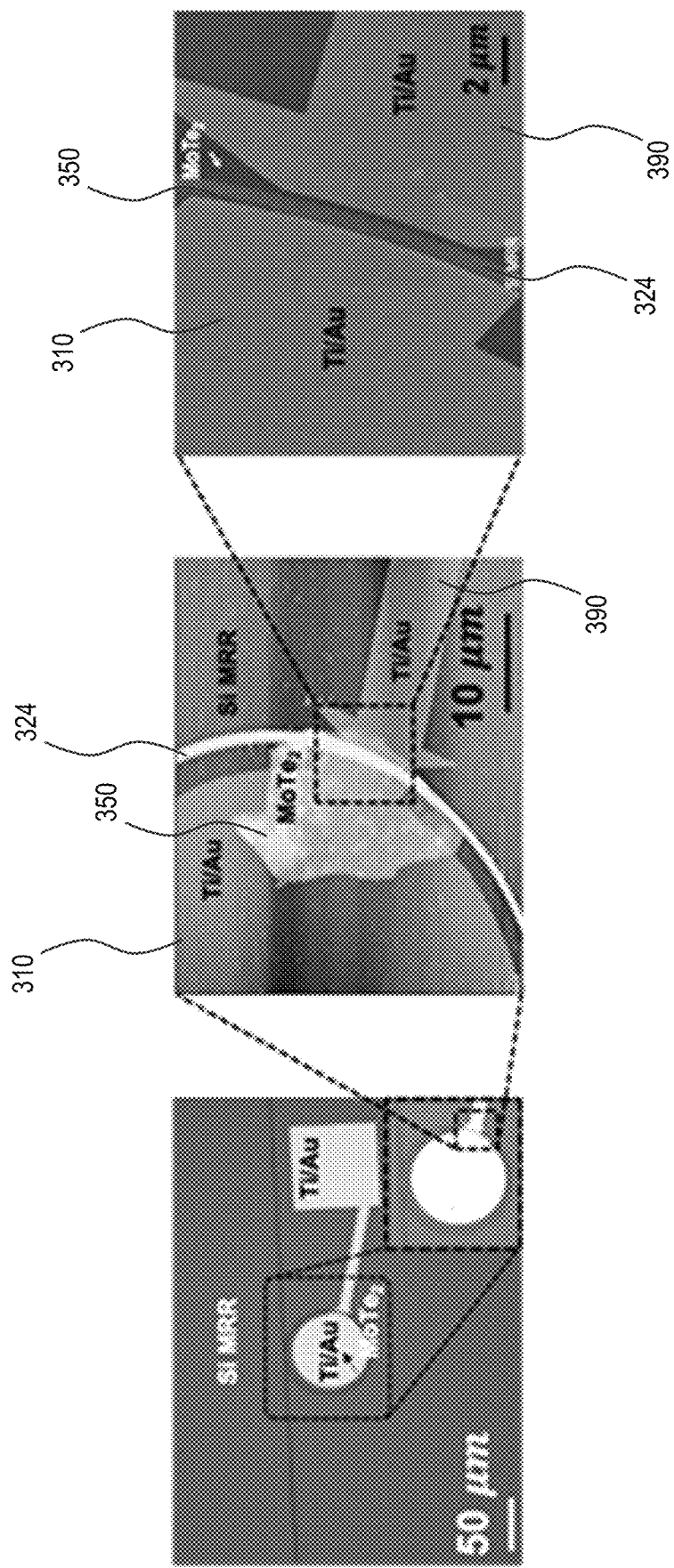
FIG. 5 illustrates the precise placement capability of exfoliated molybdenum ditelluride $MoTe_2$ flakes according to an exemplary embodiment.

FIG. 5 illustrates the precise placement capability of exfoliated MoTe$_2$ flakes according to an exemplary embodiment.

As shown in FIG. 5, MoTe$_2$ flakes are placed atop a thin (10 nm) Al2O3 layer acting as an electrical isolation layer between the silicon on insulator (SOI) photonic chip with the 2D nanocrystal. The optical mode at 1550 nm couples with the MoTe$_2$ layer through the evanescent field, leading to optical absorption and the generation of photo-generated carriers, which will be collected by the two metal electrodes 310 and 390, which may made of titanium (5 nm)/gold (45 nm), contacted on opposite sides of the microring resonator 324. The channel length of this MoTe$_2$ two-terminal photodetector may be about 800 nm with a waveguide width of about 500 nm, where one of the electrical contacts 310, 390 is positioned and 100 nm away from the edge of the ring resonator 324 to create a lateral metal semiconductor metal (M-S-M) junction that overlaps with the waveguide mode.

Figure 6:
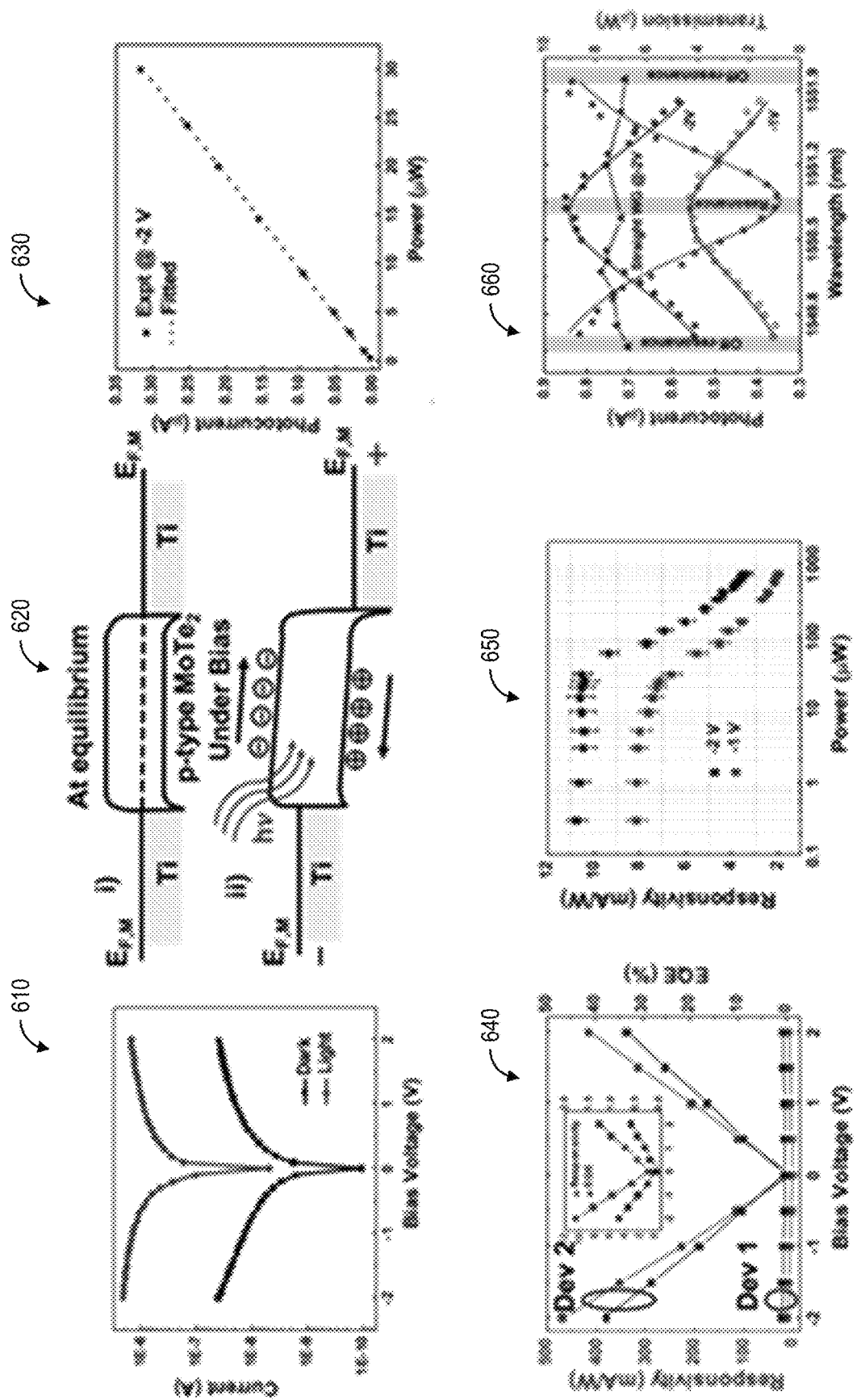
FIG. 6 illustrates graphs and a diagram regarding two exemplary devices with different dimensions of the 2D material according to an exemplary embodiment.

FIG. 6 illustrates graphs and a diagram regarding two exemplary devices with different dimensions of the 2D material according to an exemplary embodiment. For the first device, the coverage length is 15 micrometers (μm) and thickness of the transferred flakes is 40 nm. For the second device, the coverage length is 31 μm and thickness of the transferred flakes is 60 nm.

Graph 610 are representative current-voltage (I-V) curve shows efficient photodetection indicated by the 100:1 photo to dark current ratio at −1 V bias. The device is associated with low dark current ~13 nA at −1 V bias, which is about 2-3 orders and ~2 times lower compared to graphene and transition metal dichalcogenides (TMDCs)-graphene contacted photodetectors, respectively. The symmetric nature of the I-V curve indicates the formation of two back-to-back (Ti/MoTe$_2$) Schottky junctions. As shown in diagram 620, the working principle of this detector is photocarrier generation across the bandgap, where the applied voltage bias across the 2-terminal contacts enables charge carrier separation; at equilibrium, the work function (4.3 eV) of titanium ensures Fermi level alignment with the p-doped MoTe$_2$ (section i of the diagram 620). The formation of the Schottky barrier at the junction suppresses carrier transport, thus resulting in low dark current. With applied bias voltage, the potential drop across the junction reduces the Schottky barrier height (section ii of diagram 620). Upon illumination of the laser source, the generated photocarriers are separated due to the formation of a built-in potential inside the junction, resulting in a photocurrent. In order to obtain the photo-responsivity, we test the detector's response as a function of waveguide input power and bias voltage (graphs 630 and 640). After calibrating for coupling losses, we find an external responsivity (i.e. $I_{photo}/P_{input}$) of 10 and 468 mAW$^{-1}$ at −2 V for the first device (MoTe$_2$ dimensions: thickness=40 nm, MRR coverage length=15 μm) and the second device (thickness=60 nm, MRR coverage length=31 μm), respectively, which is 1.75 times higher compared to a waveguide integrated MoTe$_2$ detector tested at 1310 nm. The responsivity varies linearly as a function of bias voltage, corresponding to a back-to-back (M-S-M) junction and shows that the device is not driven yet into saturable absorption at these power levels (graphs 640 and 650). The external quantum efficiency (EQE) can be determined by, EQE=R*hc/qλ, where, R is the responsivity, h is the Planck constant, c is the speed of light in a vacuum, q is the elementary electron charge, and λ is the operating wavelength. The EQE for the first device is 1 percent and EQE for the second device is 37 at −2 V (graph 640). The variation of responsivity as a function of optical input power shows a flat response until $P_{in}$=30 μW, where state-filling blockage sets-in as the generation of excess carriers increases the radiative recombination for higher power ($P_{in}$) in the waveguide (graph 650).

Figure 7:
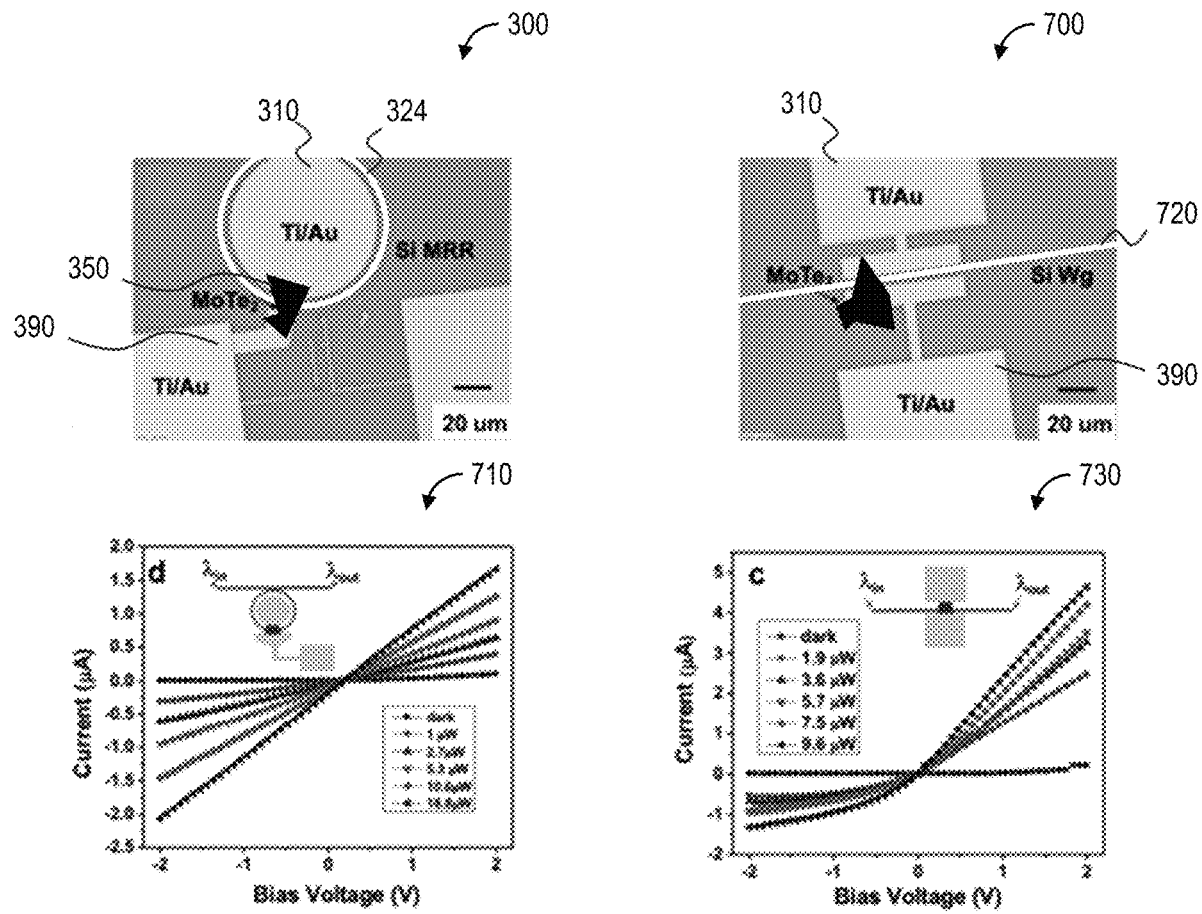
FIG. 7 includes a photocurrent graph of the photodetector and a photocurrent graph of a photodetector with a straight (non-planarized) waveguide according to an exemplary embodiment.

FIG. 7 includes a photocurrent graph 710 of the photodetector 300 and a photocurrent graph 730 of a photodetector 300 with a straight (non-planarized) waveguide 720 according to an exemplary embodiment. The high responsivity of these MoTe$_2$ detectors operating at 1550 nm can be attributed to enhanced absorption from the strain-engineered lowered bandgap and the MRR photon lifetime enhancement proportional to the finesse of the cavity. Considering the impact of the microring resonator 324 on the performance of the photodetector 300 (when operated at a fixed power of 120 μW at different bias voltages), we find a ~50 percent enhanced photocurrent ON (vs. OFF) resonance, which matches the MRR's finesse of ~1.6 (graph 660 of FIG. 6). However, the MRR integrated MoTe$_2$ photodetector 300 exhibits a ~1.2 times enhancement of the photocurrent at 1550.75 nm (on resonance), as compared to the photodetector 700 with the straight (non-planarized) waveguide 720.

Strain-induced modulation of the electronic bandgap in 2D semiconductors wrapped around a patterned substrate has previously been observed. Our experimental observation of the enhanced photocurrent for the wrapped around detector versus the planarized control sample might have also benefitted from the induced strains. We have observed a clear enhancement in photocurrent in strained (non-planarized) photodetector as compared to unstrained (planarized) one.

Figure 8:
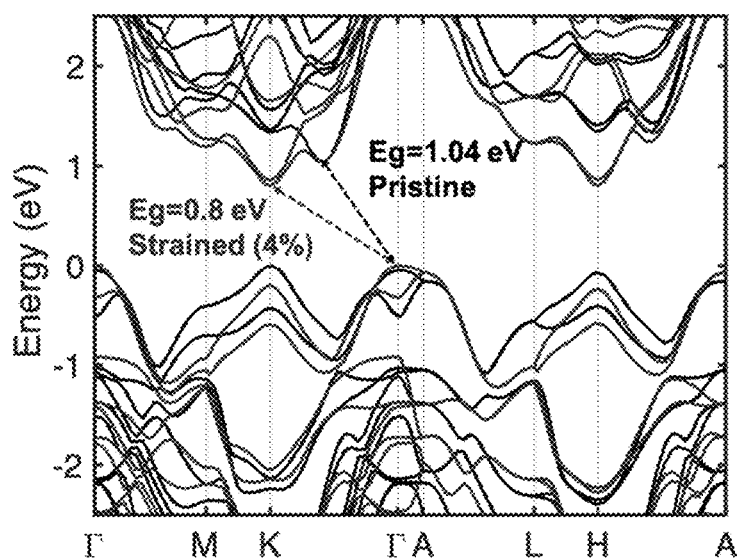
FIG. 8 illustrates calculated band structures by using first-principles density functional theory (DFT) for ML $MoTe_2$ according to an exemplary embodiment.

FIG. 8 illustrates calculated band structures by using first-principles density functional theory (DFT) for ML MoTe$_2$ according to an exemplary embodiment.

As shown in FIG. 8, the calculated band found the electronic gap to acquire a red-shift with tensile strains, potentially bridging the electronic gap with the telecom wavelength. Subject to higher tensile strain, we note that the valence bands shift towards higher energies (at Γ). In addition, the conduction bands at the K and H points shift towards lower energies and become the conduction band minimum with equal energies. As a result, the bandgap reduces from about 1.04 eV for pristine to about 0.8 eV for strained MoTe$_2$ (4%), yet the material remains an indirect band gap semiconductor. Several studies on strain induced modulation of the band structure for 2D materials where the variation of bandgap obtained from the experiment can be well explained via DFT results with a high degree of accuracy, thus supporting our observed result. However, in our case, this strain varies spatially and creates graded bandgap rather than a semiconductor of a bandgap of 0.8 eV. Therefore, $E_g$ does not end abruptly at 0.8 eV. Together, these results suggest that tensile strain can open up interband optical transitions at the telecom frequency, with are otherwise forbidden in the unstrained case. These are consistent with our observed experimental findings of enhanced photoresponse at 1550 nm for strained (vs. pristine) photodetectors discussed above.

To obtain a deeper understanding of strain-induced band structure modulation, we performed Kelvin Probe Force Microscopy (KPFM), which measured local Contact Potential Difference (CPD) between the 2D nanocrystal and an AFM probe with nanometric spatial resolution. The local work function of the 2D nanocrystal can be derived from CPD, using the relation $$V_{CPD} = \frac{\varphi_{tip} - \varphi_{sample}}{-e},$$

where $\varphi_{sample}$ is the work functions of the sample, $\varphi_{tip}$ is the work function of the tip, and e is the electronic charge. This scanning probe microscopy technique offers advantages over commonly used optical measurement techniques, including Raman and photoluminescence spectroscopy, due to nanometre (sub-diffraction limited) probe area, thus able of collecting local information about the electronic structure of the material.

Figure 9:
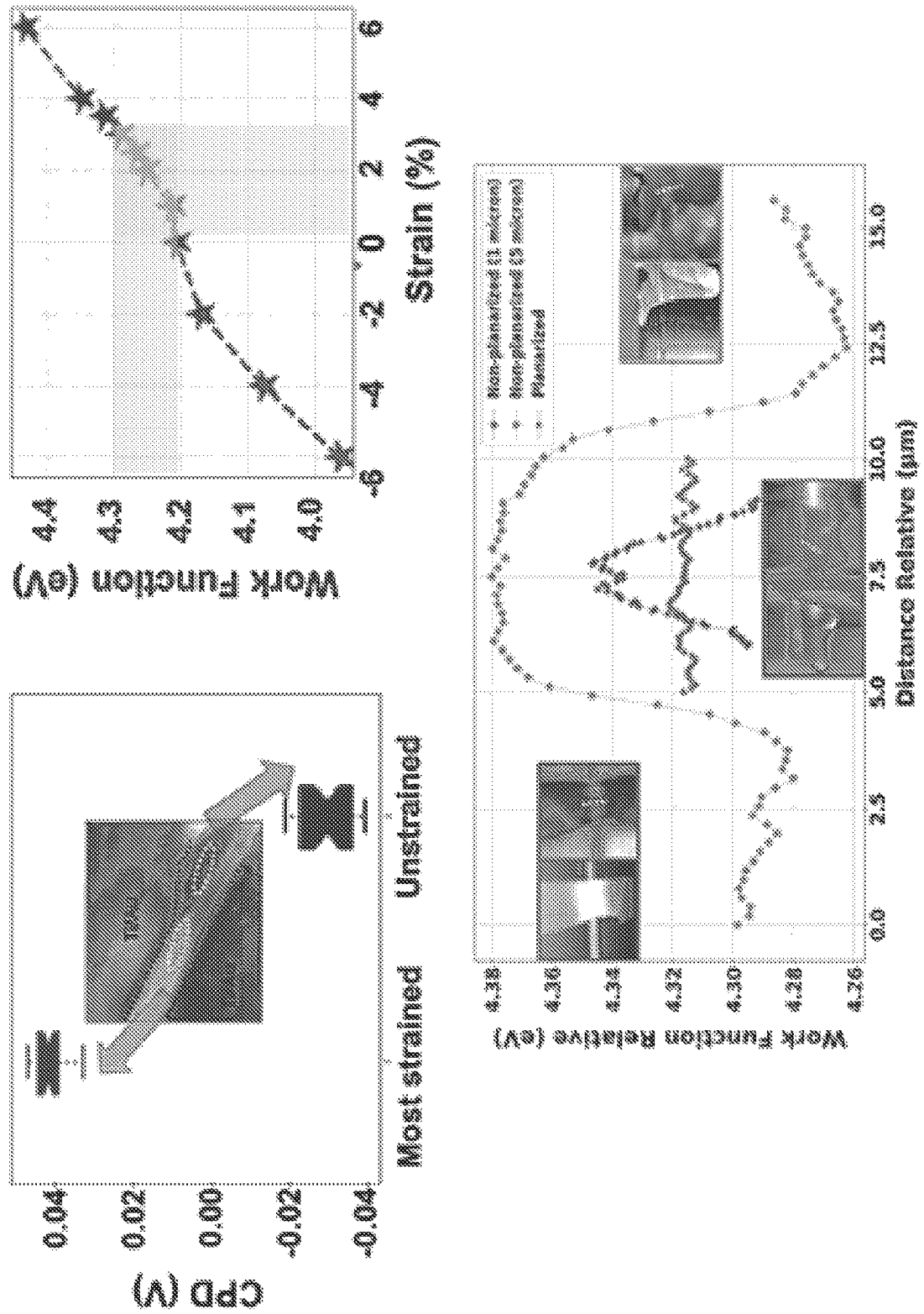
FIG. 9 is a Kelvin Probe Force Microscopy (KPFM) box plot of the first device according to an exemplary embodiment.

FIG. 9 is a KPFM box plot of the first device according to an exemplary embodiment.

As shown in FIG. 9, the first device shows a discernible increase in work function near the waveguide as compared to the flat and unstrained regions. The increment in the work function of $MoTe_2$ ($\Delta$work function ~0.08 eV) corresponds to a change of ~3% tensile strain as calculated by DFT. The mismatch in the absolute value of the work function of the material (calculated by DFT and obtained from KPFM) can be attributed to the nature of DFT calculations where $MoTe_2$ is in its isolated form, without considering the effects of substrates and environment. A similar work function change induced by strain and its detection by KPFM is reported for WS2 and graphene. Every measurement approach bears a degree of uncertainty, and so is the strain determination technique for sub-micron integrated device cross-correlating KPFM and DFT study. Note, substrate charging effects (trapped charges) can be ruled out as an origin for the observed difference in CPD at vs. off the waveguide due to the strain induced modulation of work function for the multiple devices with different geometries. Since, all the measurements were carried out in the same environment, with the same experimental set up and on the chip(s) made of same underlying substrate (SiO2), the effect of dielectric medium can be neglected/normalized from the comparison of the strained (non-planarized) and unstrained (planarized) devices. Furthermore, the $\Delta$work function (top of the waveguide—away from the waveguide) values in the same device are of utmost interest to us when estimating the amount of induced strain. Given the consistencies, and plurality of measurement and support approaches, we attribute the higher variability in the strained devices mainly due to the different amount of strain generated in the material due to different waveguide geometry.

Figure 10:
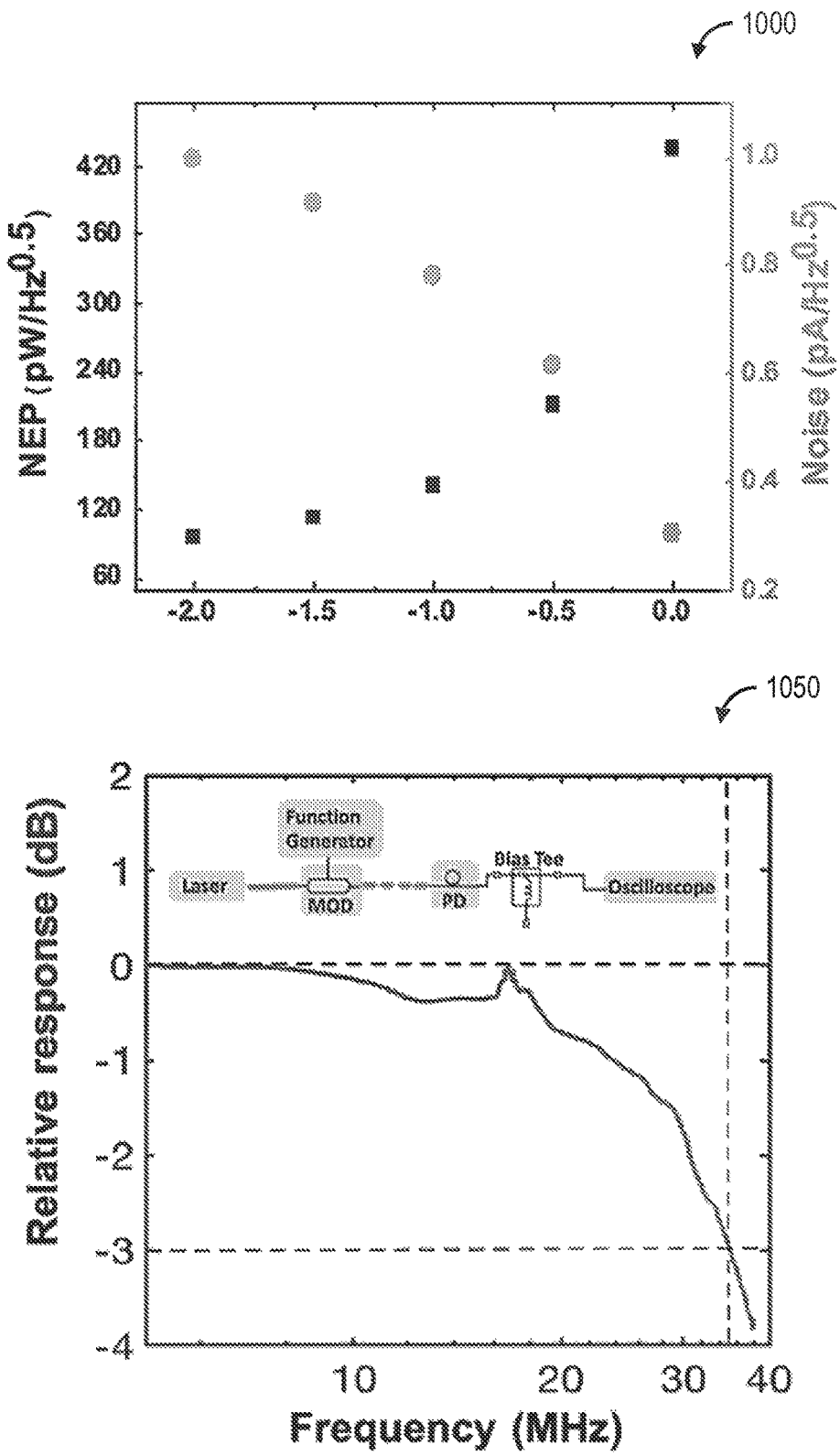
FIG. 10 is a noise graph and a responsiveness graph according to an exemplary embodiment.

FIG. 10 is a noise graph 1000 and a responsiveness graph 1050 according to an exemplary embodiment.

The strategies to improve the performance of photodetectors are not only maximizing its electrical response to light in terms of gain, but also minimizing the noise in its electrical output. To understand the detection limit of the device, we determine the noise equivalent power (NEP) i.e., the amount of incident light power that generates a photocurrent equal to the noise current, NEP=in/R, where, in is noise current and R is the responsivity. Generally, at high signal speed, there are mainly two sources of noise—i.e., shot noise ($\sqrt{(2qI_d)}$) and Johnson noise ($\sqrt{(4k_BT/R_{sh})}$)—that contribute to the total noise current. However, for a photodetector operating at a photo conducting mode, shot noise always dominates over Johnson noise. As shown in the noise graph 1000, NEP is found to be ~90 pW/Hz$^{0.5}$, lowest among the devices, although the second device shows higher responsivity (high dark current) thus revealing the trade-off between sensitivity and noise current. However, our device shows ~2 orders higher sensitivity than graphene/Si photodetector due to lower dark current when operating at photoconductive mode, and comparable sensitivity to NEP to BP photodetectors. The variation of NEP shows a gradual decrease for higher bias voltage, enabling low light level sensing, which can be further improved by the formation of a p-n junction.

The responsiveness graph 1050 illustrates a dynamic response test of the detector using a modulated laser input. The modulated optical output is coupled into the device where the electrical output was measured through a radio frequency microwave probe, and the normalized frequency response analyzed via the S21 parameter of the network analyzer. Our photodetector device displays a 3 dB bandwidth of 35.6 MHz at 2 V. The response time of a cavity integrated photodetector is mainly governed by these three factors: i) carrier transit time ($\tau_{tr}$) charge/discharge time of the junction capacitance ($\tau_{RC}$) and photon lifetime ($\tau_{cav}$). Hence, the temporal response of the detector is determined by $\tau_R=\sqrt{(\tau_{tr}^2+\tau_{RC}^2+\tau_{cav}^2)}$. Here, the transit time is given by $\tau_{tr}=l^2/2\ \mu V_{bias}$, where l is the channel length of the $MoTe_2$ detector and $\mu$ is the carrier mobility. From this top gated configuration, when the 2D nanocrystal is atop the waveguide, the field-effect mobility is 1.2 cm$^2$/Vs. With a channel length of 0.8 µm, the transit time is found to be 3.2 ns ($f_{3dB-estimated}$ ~49.7 MHz), and the main limiting factor. To optimize the response speed of detector even further, the devices require to suppress dark current and form an effective carrier transport pathway with type-II band alignments, facilitate efficient electron-hole separation and light detection due to built-in field. Rely on the effective charge transfer at the interface to build a Schottky or p-n junction, the rectification characteristics suppress dark current and photovoltage effect provides effective transmission and built-in electric field.

Figure 11:
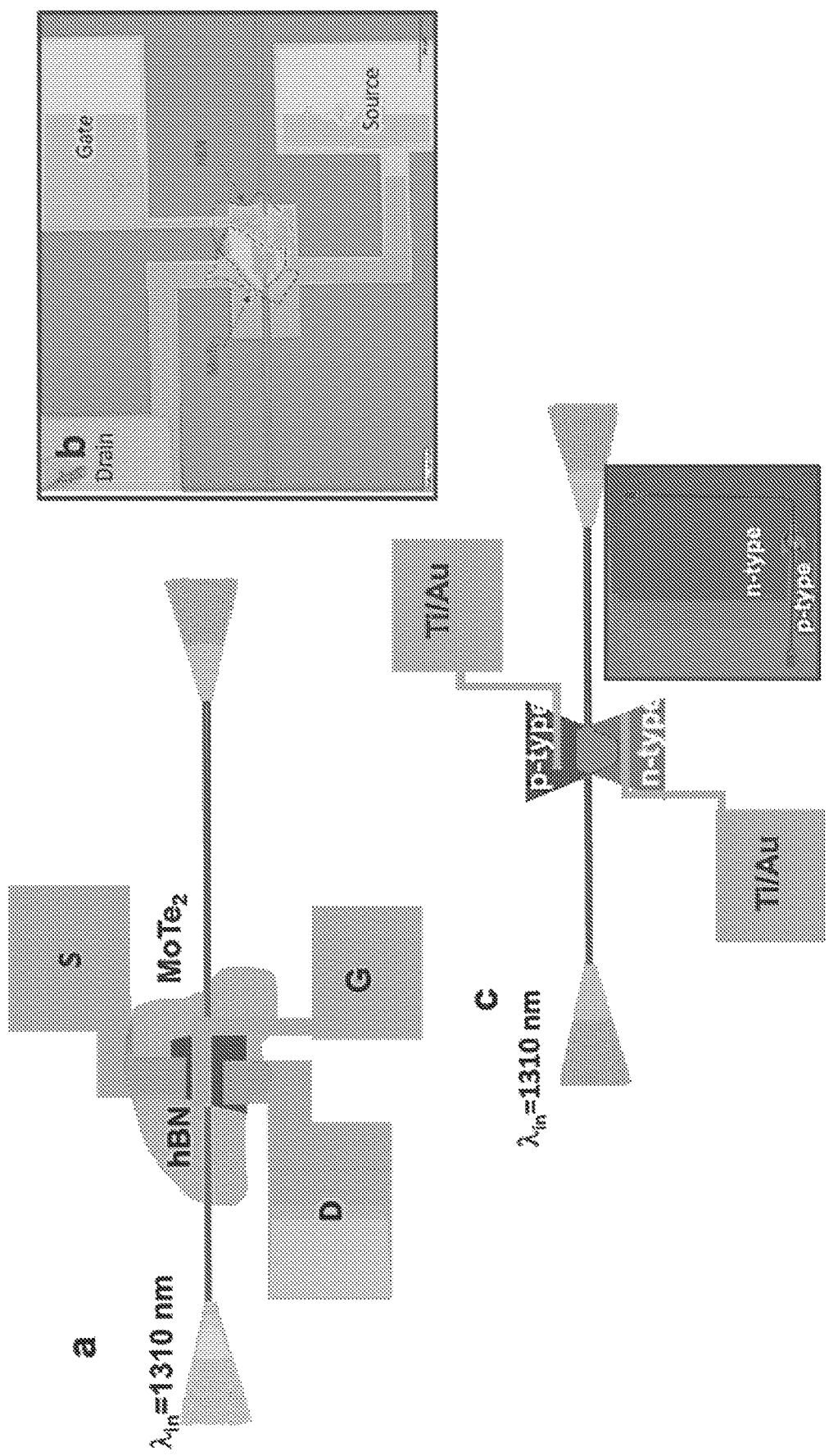
FIG. 11 illustrates the emergence of van der Waals (vdW) stacking 2D materials heterojunction, which offers a method for high-quality vertical heterojunction that could be realized on integrated photonic platform according to an exemplary embodiment.

However, as shown in the exemplary embodiment of FIG. 11, the emergence of van der Waals (vdW) stacking 2D materials heterojunction offers a method for high-quality vertical heterojunction could be realized on integrated photonic platform. Here, the speed can be further engineered by encapsulating the $MoTe_2$ using hexagonal boron nitride (hBN) or trivially reducing the channel length, to optimize overall gain-bandwidth product.

In conclusion, we demonstrate a strain-induced absorption-enhanced 2D nanocrystal ($MoTe_2$) silicon photonic microring-integrated photodetector featuring high responsivity of 0.01 A/W (the first device) and ~0.5 A/W (the second device) at 1550 nm, with a low NEP of 90 pW/Hz$^{0.5}$. Subject to mechanical strain, the bandgap of $MoTe_2$ shifts from 1.04 eV for unstrained to 0.80 eV for strained, when the 2D nanocrystal is wrapped around a non-planarized silicon waveguide. The local enhancement of the work function mapped out by KPFM, confirms a local change of electronic structure of the material due to strain. The device responsivity can be further improved using a high-Q cavity resonator. We observe 3 dB bandwidth of 35 MHz, where the response time is transit time-limited. This strain engineered bandgap enables optical absorption at 1550 nm, resulting in an integrated photonic detector that could potentially open up a new pathway for future on-chip photonic circuits.

The foregoing description and drawings should be considered as illustrative only of the principles of the disclosure, which may be configured in a variety of shapes and sizes and is not intended to be limited by the embodiment herein described. Numerous applications of the disclosure will readily occur to those skilled in the art. Therefore, it is not desired to limit the disclosure to the specific examples disclosed or the exact construction and operation shown and described. Rather, all suitable modifications and equivalents may be resorted to, falling within the scope of the disclosure.

What is claimed is:
1. A photonic device, comprising:
   a waveguide having a first side and a second side opposite the first side;
   a first electrode at the first side of said waveguide and physically disconnected from said waveguide;
   a second electrode at the second side of said waveguide and physically disconnected from said waveguide; and a two-dimensional (2D) material directly coupled to the first electrode and the second electrode to directly electrically connect the first electrode with the second electrode.

2. The photonic device according to claim 1, wherein the 2D material is molybdenum ditelluride.

3. The photonic device according to claim 1, wherein the 2D material is strained.

4. The photonic device according to claim 3, wherein the 2D material is strained by placing the 2D material on the waveguide.

5. The photonic device according to claim 3, wherein the 2D material is strained by imparting a force on at least a portion of the 2D material.

6. The photonic device according to claim 3, wherein photonic device modulates an amount of strain imposed on the 2D material by modulating an amount of force imparted on the 2D material.

7. The photonic device according to claim 6, wherein:
the photonic device receives an optical signal;
the optical signal interacts with the strained 2D material;
the strained 2D material absorbs a portion of the optical signal;
the photonic device outputs an unabsorbed portion of the optical signal; and
the photonic device:
modulates an amount of the optical signal absorbed by the strained 2D material by modulating the amount of strain induced in the strained 2D material; and
modulates an amplitude of the unabsorbed optical signal output by the photonic device by modulating the amount of the optical signal absorbed by the strained 2D material.

8. The photonic device according to claim 6, wherein:
the photonic device receives an optical signal, separates the optical signal into a first beam and a second beam, and combines the first beam and the second beam;
the first beam interacts with the strained 2D material;
the strained 2D material introduces a delay in the first beam; and
the photonic device modulates a phase difference between the first beam and the second beam by modulating the amount of strain induced in the strained 2D material.

9. The photonic device according to claim 3, wherein the photonic device is a photodetector and the strained 2D material absorbs light energy and converts the light energy into a photocurrent in a circuit that includes the first and second electrodes.

10. The photonic device according to claim 3, wherein the photonic device is a light emitter and the strained 2D material emits light energy in response to an electric field, an injected current, or an optically pumped excitation.

11. A method of making a photonic device, the method comprising:
providing a first electrode at a first side of a waveguide, the first electrode physically disconnected from the waveguide;
providing a second electrode at a second side of the waveguide opposite the first side, the second electrode physically disconnected from the waveguide; and
directly coupling a two-dimensional (2D) material to the first electrode and the second electrode to directly electrically connect the first electrode with the second electrode.

12. The method according to claim 11, wherein the 2D material is molybdenum ditelluride.

13. The method according to claim 11, further comprising:
inducing strain in the 2D material.

14. The method according to claim 13, wherein inducing strain in the 2D material comprising:
providing a non-planarized waveguide and inducing strain in the 2D material by placing the 2D material on the non-planarized waveguide.

15. The method according to claim 14, further comprising: absorbing light energy, by the strained 2D material, and converting the light energy into a photocurrent in a circuit that includes the two electrodes.

16. The method according to claim 14, further comprising:
emitting light energy, by the strained 2D material, in response to an electric field across the two electrodes.

17. The method according to claim 13, wherein inducing strain in the 2D material comprises imparting a force on at least a portion of the 2D material.

18. The method according to claim 13, wherein inducing strain in the 2D material comprises modulating an amount of strain imposed on the 2D material by modulating an amount of force imparting imparted on the 2D material.

19. The method according to claim 18, further comprising:
receiving an optical signal that interacts with the 2D material via the waveguide;
absorbing a portion of the optical signal, by the optical signal;
modulating an amplitude of the portion of the optical signal absorbed by the strained 2D material by modulating the amount of strain induced in the 2D material;
modulating an amplitude of the unabsorbed optical signal by modulating the amount of the optical signal absorbed by the strained 2D material; and
outputting the unabsorbed portion of the optical signal.

20. The method according to claim 18, wherein:
receiving an optical signal;
separating the optical signal into a first beam that interacts with the 2D material and a second beam;
modulating a phase difference between the first beam and the second beam by modulating the amount of strain induced in the 2D material.

21. A photonic device, comprising:
a waveguide receiving an optical signal and having an optical signal output, said waveguide having a first side and a second side opposite the first side;
a first electrode physically disconnected from said waveguide at the first side of said waveguide;
a second electrode physically disconnected from said waveguide at the second side of said waveguide with said waveguide between said first electrode and said second electrode; and
a two-dimensional (2D) material directly coupled to said first electrode and said second electrode to directly electrically connect said first electrode and said second electrode, said 2D material extending across said waveguide from said first electrode to said second electrode, said 2D material configured to absorb an amount of the optical signal based on an amount of strain on said 2D material and configured to modulate an amplitude of an unabsorbed optical signal at the output signal output based on the amount of optical signal absorbed by said 2D material.

22. The device of claim 21, wherein the strain on said 2D material is induced by said waveguide.

23. The device of claim 21, wherein said waveguide is physically between said first and second electrodes.

24. The device of claim 21, wherein said waveguide is elongated, said first electrode is at a first elongated side of said waveguide, said second electrode is at a second elongated side of said waveguide, and said 2D material extends transversely across said waveguide.

* * * * *